(12) United States Patent
Mochizuki

(10) Patent No.: US 8,228,967 B2
(45) Date of Patent: Jul. 24, 2012

(54) LIGHT EMITTING DEVICE

(75) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 148 days.

(21) Appl. No.: 12/722,792

(22) Filed: Mar. 12, 2010

(65) Prior Publication Data

US 2010/0232467 A1 Sep. 16, 2010

(30) Foreign Application Priority Data

Mar. 16, 2009 (JP) ................................. 2009-062502

(51) Int. Cl.
*H01S 3/081* (2006.01)

(52) U.S. Cl. ........... 372/93; 372/92; 372/97; 372/43.01; 372/45.01; 372/46.01; 372/46.012; 372/46.011; 257/98

(58) Field of Classification Search .................... 372/92, 372/93, 97, 43.01, 45.01, 46.01, 46.012, 372/46.011; 257/98
See application file for complete search history.

(56) References Cited

U.S. PATENT DOCUMENTS

| | | | |
|---|---|---|---|
| 3,982,204 A * | 9/1976 | Andringa | 372/61 |
| 5,088,105 A * | 2/1992 | Scifres et al. | 372/92 |
| 6,243,516 B1 * | 6/2001 | Seino | 385/47 |
| 6,542,529 B1 * | 4/2003 | Hagberg et al. | 372/46.01 |
| 2003/0048826 A1 * | 3/2003 | Bethel et al. | 372/55 |

FOREIGN PATENT DOCUMENTS

| | | |
|---|---|---|
| JP | 11-064789 | 3/1999 |
| WO | WO 2006134394 A1 * | 12/2006 |

* cited by examiner

*Primary Examiner* — Jessica Stultz
*Assistant Examiner* — Joshua King
(74) *Attorney, Agent, or Firm* — Harness, Dickey & Pierce, P.L.C.

(57) ABSTRACT

A light emitting device includes first and second cladding layers and an active layer therebetween including first and second side surfaces and first and second gain regions, a second side reflectance is higher than a first side reflectance, a first end surface part of the first gain region overlaps a second end surface part of the second gain region in an overlapping plane, the first gain region obliquely extends from the first end surface to a third end surface, the second gain region obliquely extends from the second end surface to a fourth end surface, a first center line connecting the centers of the first and third end surfaces and a second center line connecting the centers of the second and fourth end surfaces intersect, and the overlapping plane is shifted from the intersection point toward the first side surface.

11 Claims, 6 Drawing Sheets

LIGHT EMITTING DEVICE

BACKGROUND

1. Technical Field

The present invention relates to a light emitting device.

2. Related Art

In recent years, a high-intensity laser device superior in color reproducibility has become a promising light emitting device for a light source of a display device such as a projector or a monitor display. However, in some cases, there might arise a problem of a speckle noise caused by mutual interference of scattered light on a screen surface. To solve this problem, for example, there has been proposed a method of fluctuating the screen to vary the speckle pattern for reducing the speckle noise in JP-A-11-64789.

However, according to the method disclosed in the document mentioned above, there might arise another problem that the screen is limited, and that an additional member for moving the screen such as motor is required, and that a noisy sound is caused by the motor or the like.

Further, it is also possible to use a general light emitting diode (LED) for the light source in order to reduce the speckle noise. However, there might be the case in which the LED fails to provide a sufficient output power.

SUMMARY

An advantage of the invention is to provide a novel light emitting device capable of reducing the speckle noise and providing a high output power.

According to an aspect of the invention, there is provided a light emitting device including a first cladding layer, an active layer formed above the first cladding layer, and a second cladding layer formed above the active layer, wherein the active layer includes a first side surface and a second side surface parallel to the first side surface. At least a part of the active layer constitutes a first gain region and a second gain region, a reflectance of the second side surface is higher than that of the first side surface at a wavelength of light generated in the first gain region and the second gain region. A part of a first end surface of the first gain region located on a side of the second side surface and a part of a second end surface of the second gain region located on a side of the second side surface overlap with each other in an overlapping plane. The first gain region is disposed from the first end surface to a third end surface, which is located on the side of the first side surface, obliquely to a perpendicular line of the first side surface, and the second gain region is disposed from the second end surface to a fourth end surface, which is located on the side of the first side surface, obliquely to the perpendicular line of the first side surface. A first center line connecting a center of the first end surface and a center of the third end surface and a second center line connecting a center of the second end surface and a center of the fourth end surface have an intersection point, and the overlapping plane is shifted from the intersection point in a direction from the second side surface toward the first side surface.

In the light emitting device according to the aspect of the invention, the laser oscillation of the light generated in the gain regions can be suppressed or prevented as described later. Therefore, the mutual interference of the scattered light can be suppressed, and thus the speckle noise can be reduced. Further, in the light emitting device according to the invention, the light generated in the gain regions can proceed while receiving a gain in each gain regions, and then be emitted to outside. Therefore, it is possible to obtain a higher output power than that of the general LED of the related art. As described above, according to the aspect of the invention, a novel light emitting device capable of reducing the speckle noise with high output power can be provided.

It should be noted that in the descriptions related to the invention, the term "above" is used in such a phrase as "a specific object (hereinafter referred to as "B") is formed "above" another specific object (hereinafter referred to as "A")." In the descriptions related to the invention, in such a case as this example, the term "above" is used in order to include the case of forming B directly on A and the case of forming B on A via something else.

According to another aspect of the invention, in the light emitting device of the above invention, it is also possible that a width of the first gain region in the vicinity of the overlapping plane and a width of the second gain region in the vicinity of the overlapping plane are equal to each other in a plan view, and that the displacement L and the width W satisfy the following formula 1, assuming that a displacement between the intersection point and the overlapping plane is L, and the width of the first gain region in the vicinity of the overlapping region and the width of the second gain region in the vicinity of the overlapping region are W.

$$0<L<W \tag{1}$$

According to another aspect of the invention, in the light emitting device of the above invention, it is also possible that the displacement L and the width W satisfy the following formula 2.

$$(W/4) \leq L \leq (3W/4) \tag{2}$$

According to another aspect of the invention, in the light emitting device of the above invention, it is also possible that the displacement L and the width W satisfy the following formula 3.

$$L=(W/2) \tag{3}$$

According to another aspect of the invention, in the light emitting device of the above invention, it is also possible that the first gain region is disposed from the first end surface to the third end surface with a constant width, and the second gain region is disposed from the second end surface to the fourth end surface with a constant width, and that the width of the first and the second gain regions are equal to each other.

According to another aspect of the invention, in the light emitting device of the above invention, it is also possible that the second side surface is provided with a reflecting section.

According to another aspect of the invention, in the light emitting device of the above invention, it is also possible that a planar shape of the first gain region and a planar shape of the second gain region are axisymmetrical with each other about a perpendicular line of the overlapping plane.

According to another aspect of the invention, in the light emitting device of the above invention, it is also possible that the first gain region has a reflecting plane between the first end surface and the third end surface, and the reflecting plane is adapted to reflect light proceeding in the first gain region. The light emitted from the third end surface and the light emitted from the fourth end surface can proceed in the same direction by introducing the reflecting plane in the first gain region.

According to another aspect of the invention, in the light emitting device of the above invention, it is also possible in a plan view from the side of the first side surface of the active layer that there is no overlap between the first end surface and the third end surface of the first gain region, and that there is no overlap between the second end surface and the fourth end surface of the second gain region.

According to another aspect of the invention, in the light emitting device of the above invention, it is also possible that a part of the light generated from the first gain region is reflected by the overlapping plane and is emitted from the fourth end surface of the second gain region, and that a part of the light generated from the second gain region is reflected by the overlapping plane and is emitted from the third end surface of the first gain region.

According to another aspect of the invention, in the light emitting device of the above invention, it is also possible that a first electrode electrically connected to the first cladding layer and a second electrode electrically connected to the second cladding layer are further provided.

It should be noted that in the descriptions related to the invention, the term "electrically connected" is used in such a phrase as "a specific member (hereinafter referred to as a "member D") "electrically connected" to another specific member (hereinafter referred to as a "member C")." In the descriptions related to the invention, in such a case as this example, the term "electrically connected" is used in order to include the case in which the member C and the member D are electrically connected while having direct contact with each other and the case in which the member C and the member D are electrically connected via another member.

According to another aspect of the invention, in the light emitting device of the above invention, it is also possible that a contact layer is further provided above the second cladding layer, and is in ohmic contact with the second electrode. At least the contact layer and a part of the second cladding layer can constitute a columnar section, and a planar shape of the columnar section can be identical to that of the first gain region and the second gain region.

BRIEF DESCRIPTION OF THE DRAWINGS

The invention will now be described with reference to the accompanying drawings, wherein numbers refer to the elements of the device of the invention.

DESCRIPTION OF EXEMPLARY EMBODIMENTS

A preferred embodiment of the invention will be described hereinafter with reference to the accompanying drawings.

1. Light Emitting Device

Figure 1:
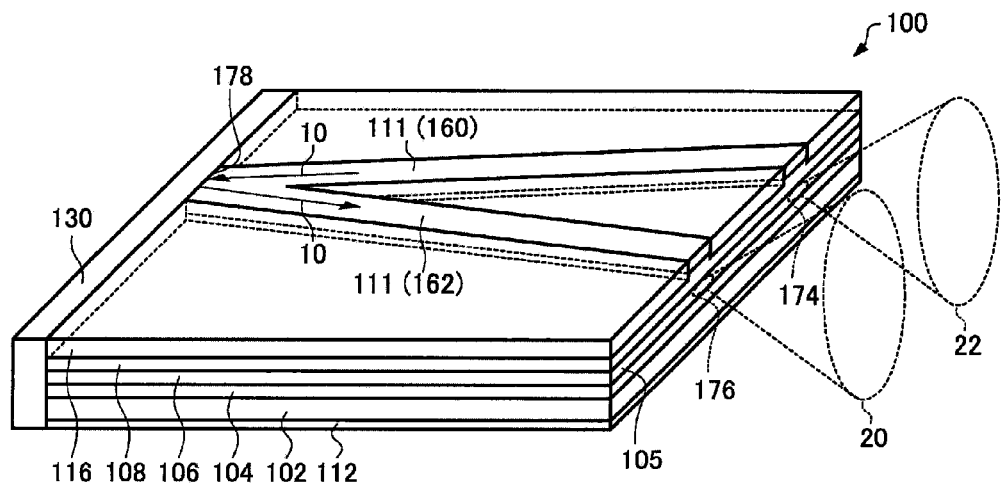
FIG. 1 is a perspective view schematically showing a light emitting device according to the present embodiment.
Figure 2:
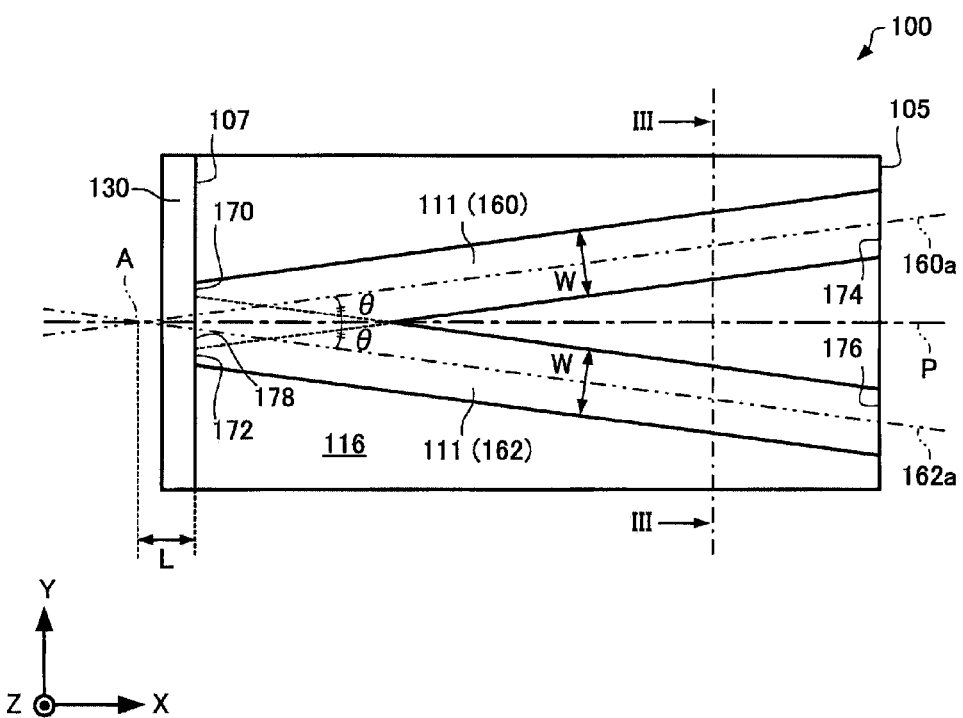
FIG. 2 is a plan view schematically showing the light emitting device according to the present embodiment.
Figure 3:
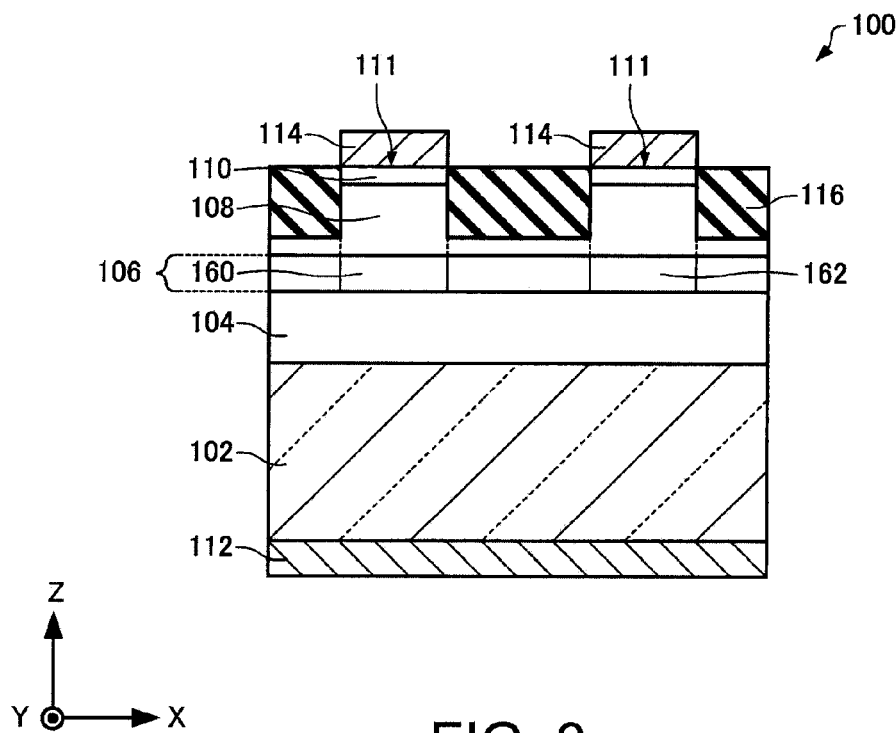
FIG. 3 is a cross-sectional view schematically showing the light emitting device according to the present embodiment.

Firstly, a light emitting device according to the present embodiment will be explained with reference to the accompanying drawings. FIG. 1 is a perspective view schematically showing the light emitting device 100 according to the present embodiment. FIG. 2 is a plan view schematically showing the light emitting device 100 according to the present embodiment. FIG. 3 is a cross-sectional view along the III-III line shown in FIG. 2, and schematically shows the light emitting device 100 according to the present embodiment. In FIGS. 1 and 2, a second electrode 114 is omitted from illustration for the sake of convenience. Further, the case which the light emitting device 100 is an InGaAlP type (red) semiconductor light emitting device will be explained here.

As shown in FIGS. 1 through 3, the light emitting device 100 includes a first cladding layer 104, an active layer 106, and a second cladding layer 108. The light emitting device 100 can further include a substrate 102, a contact layer 110, an insulating layer 116, a first electrode 112, and a second electrode 114.

As the substrate 102, a GaAs substrate with a first conductivity type (e.g., n-type), for example, can be used.

The first cladding layer 104 is formed on the substrate 102. As the first cladding layer 104, for example, an n-type InGaAlP layer can be used. Although not shown in the drawings, it is also possible to form a buffer layer between the first substrate 102 and the first cladding layer 104. As the buffer layer, an n-type GaAs layer, an n-type InGaP layer, and so on can be used.

The active layer 106 is formed on the first cladding layer 104. The active layer 106 has, for example, a multiple quantum well (MQW) structure obtained by stacking three quantum well structures each composed of an InGaP well layer and an InGaAlP barrier layer.

Some part of the active layer 106 constitutes a plurality of gain regions. In the example shown in the drawing, part of the active layer 106 constitutes a first gain region 160 and a second gain region 162. Although not shown in the drawing, it is also possible that the active layer 106 has another gain region in addition to the first and the second gain regions 160, 162, and that the plurality of gain regions including the gain regions 160, 162 is arranged to form an array.

The gain regions 160, 162 can generate light, and the light can receive gains in the gain regions 160, 162. The shape of the active layer 106 is, for example, a rectangular solid (including a cube). As shown in FIG. 2, the active layer 106 has a first side surface 105 and a second side surface 107. The first side surface 105 and the second side surface 107 is parallel to each other. At the wavelength of the light generated in the gain regions 160, 162, the reflectance of the second side surface 107 is higher than that of the first side surface 105. For example, as shown in FIGS. 1 and 2, the high reflectance can be obtained by covering the second side surface 107 with a reflective section 130. The reflective section 130 has a high reflective structure such as a dielectric mirror or a metallic mirror. More specifically, as the reflective section 130, it is possible to use, for example, a mirror having 10 pairs of layers of $SiO_2$ and $Ta_2O_5$ stacked in this order from the side of the second side surface 107. It is preferable that the reflectance of the second side surface 107 is 100% or almost 100%. In contrast, it is preferable that the reflectance of the first side surface 105 is 0% or almost 0%. For example, by covering the first side surface 105 with an antireflection coating (not shown), it is possible to obtain low reflectance. It should be noted that the reflective section 130 is not limited to the example described above. An $Al_2O_3$ layer, a $TiO_2$ layer, a TiN layer, an SiN layer, and a multilayer film thereof, for example, can be used instead.

Each of the gain regions 160, 162 is disposed from the second side surface 107 to the first side surface 105 in a direction tilted with respect to the perpendicular line P of the first side surface 105 in a plan view shown in FIG. 2. Thus, the laser oscillation of the light generated in the gain regions 160, 162 can be suppressed or prevented. The first gain region 160 and the second gain region 162 are disposed in the directions different from each other. In the example shown in the drawing, the first gain region 160 is tilted toward one side at an angle θ with respect to the perpendicular line P. The second gain region 162 is tilted toward the other side (the side opposite to the one side) at an angle θ with respect to the perpendicular line P.

As shown in FIG. 2, the first gain region 160 has a first end surface 170 provided to the second side surface 107 and a third end surface 174 provided to the first side surface 105. The second gain region 162 has a second end surface 172 provided to the second side surface 107 and a fourth end surface 176 provided to the first side surface 105. The width of the first gain region 160 in the first end surface 170 and the width of the second gain region 162 in the second end surface 172 are equal to each other. In the example shown in the drawing, the first gain region 160 has a constant width W from the first end surface 170 to the third end surface 174, and the second gain region 162 has a constant width W from the second end surface 172 to the fourth end surface 176. In other words, the planar shape of the first gain region 160 and the second gain region 162 are parallelogram. In the example shown in the drawing, the width W of the first gain region 160 and the width W of the second gain region 162 are also equal to each other.

A part of the first end surface 170 and a part of the second end surface 172 overlap each other in an overlapping plane 178. In other words, it can be said that the first end surface 170 and the second end surface 172 form a single continuous plane. The first end surface 170 can reflect the light generated in the first gain region 160. The second end surface 172 can reflect the light generated in the second gain region 162. The planar shape of the first gain region 160 and the planar shape of the second gain region 162 can be axisymmetrical with each other with respect to the perpendicular line P of the first side surface 105. The planar shape of the first and the second gain regions 160, 162 can also be axisymmetrical with respect to a perpendicular line of the overlapping plane 178.

Although not shown in the drawings, the first end surface 170 and the second end surface 172 can be provided to an opening section formed in the active layer 106 instead of the side surface of the active layer 106.

As shown in FIG. 2, a first center line 160a connecting the center of the first end surface 170 and the center of the third end surface 174 of the first gain region 160 and a second center line 162a connecting the center of the second end surface 172 and the center of the fourth end surface 176 of the second gain region 162 have an intersection point A. The overlapping plane 178 (the second side surface 107) is shifted toward the side of the first side surface 105 (+X direction) away from the intersection point A. When denoting the displacement between the intersection point A and the overlapping plane 178 (i.e., the displacement between the intersection point A and the second side surface 107) as L, and the width of the gain regions 160, 162 as W, the displacement L and the width W satisfy the formula 1 described below.

$$0 < L < W \quad (1)$$

Further, the displacement L and the width W preferably satisfy the formula 2 described below.

$$(W/4) \leq L \leq (3W/4) \quad (2)$$

Further, the displacement L and the width W preferably satisfy the formula 3 described below.

$$L = (W/2) \quad (3)$$

It should be noted that the first center line 160a can be the line intermediate of the two sides of the first gain region 160 that is not on the first end surface 170 or the third end surface 174 in the plan view as shown in FIG. 2. Similarly, the second center line 162a can be the line intermediate of the two sides of the second gain region 162 that is not on the second end surface 172 or the fourth end surface 176. The width W of the first gain region 160 is the distance between the two sides of the first gain region 160 parallel to the first center line 160a in the plan view as shown in FIG. 2. Similarly, the width W of the second gain region 162 is the distance between the two sides of the second gain region 162 parallel to the second center line 162a.

If the displacement L and the width W satisfy the relations described above, the light emitting device 100 can efficiently emit light. The details explanation of that will be described later.

Figure 4:
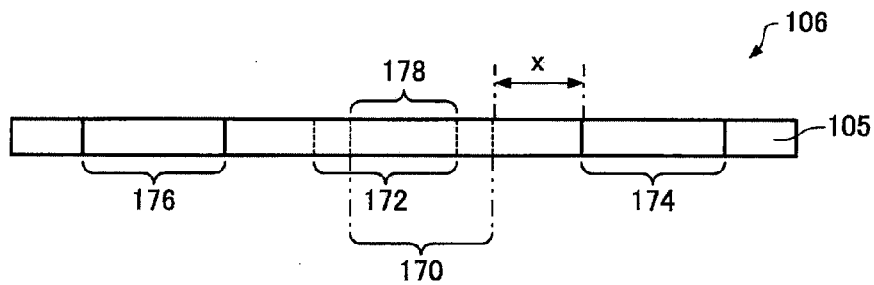
FIG. 4 is a diagram of an active layer according to the present embodiment viewed from a first side surface side in a planar manner.

FIG. 4 is a diagram of the active layer 106 viewed from the side of the first side surface 105 in a planar manner. As shown in FIG. 4, the first end surface 170 and the third end surface 174 of the first gain region 160 do not overlap with each other. Similarly, the second end surface 172 and the fourth end surface 176 of the second gain region 162 do not overlap with each other. Thus, it is possible to prevent the direct multiple reflection of the light generated in the first gain region 160 between the first end surface 170 and the third end surface 174, and the direct multiple reflection of the light generated in the second gain region 162 between the second end surface 172 and the fourth end surface 176. As a result, since it is possible to prevent constitution of the direct resonator, it becomes possible to more reliably suppress or prevent the laser oscillation of the light generated in the gain regions 160, 162. Therefore, the light emitting device 100 can emit non-laser light. In the case shown in FIG. 4, for example, it is sufficient that the shift width x between the first end surface 170 and the third end surface 174 takes a positive value.

As shown in FIGS. 1 and 3, the second cladding layer 108 is formed on the active layer 106. As the second cladding layer 108, for example, an InGaAlP layer of a second conductivity type (e.g., p-type), can be used.

For example, a pin diode is formed by the p-type second cladding layer 108, the active layer 106 with no impurity doped, and the n-type first cladding layer 104. Each of the first cladding layer 104 and the second cladding layer 108 has a forbidden band gap larger than that of the active layer 106 and a refractive index smaller than that of the active layer 106. The active layer 106 has a function of amplifying the light. The first cladding layer 104 and the second cladding layer 108 have a function of confining injection carriers (electrons and holes) and the light in the active layer 106.

In the light emitting device 100, when applying a forward bias voltage of the pin diode between a first electrode 112 and a second electrode 114, there occurs recombination of the electron and the hole in the gain regions 160, 162 of the active layer 106. The recombination causes the light emission. Originating from the generated light, stimulated emission occurs and the light intensity is amplified inside the gain regions 160, 162. For example, as shown in FIG. 1, a part of the light 10 generated in the first gain region 160 is amplified inside the first gain region 160, and then reflected at the overlapping plane 178 and emitted from the fourth end surface 176 of the second gain region 162 as outgoing light 20. In this case, the intensity of the part of the generated light 10 is also amplified inside the second gain region 162 after the reflection. Similarly, a part of the light generated in the second gain region 162 is also amplified inside the second gain region 162, and then reflected at the overlapping plane 178 and emitted from the third end surface 174 of the first gain region 160 as outgoing light 22. In this case, the intensity of part of the generated light is also amplified inside the first gain region 160 after the reflection. It should be noted that some of the light generated in the first gain region 160 is emitted directly from the third end surface 174 as the outgoing light 22. Similarly, some of the light generated in the second gain region 162 is emitted directly from the fourth end surface 176 as the outgoing light 20. Such light is also amplified inside the respective gain regions 160, 162 in the similar manner.

As shown in FIGS. 1 and 3, the contact layer 110 is formed on the second cladding layer 108. As the contact layer 110, the layer having an ohmic contact with the second electrode 114 can be used. As the contact layer 110, a p-type GaAs layer, for example, can be used.

The contact layer 110 and part of the second cladding layer 108 can form a columnar section 111. As shown in FIG. 2, the planar shape of the columnar section 111 is, for example, the same as that of the gain region 160, 162. In other words, the current channel between the electrodes 112, 114 is determined by the planar shape of the columnar section 111, for example, and as a result, the planar shapes of the gain regions 160, 162 are determined. Although not shown in the drawings, the columnar section 111 can also be constituted with, for example, the contact layer 110, a part of the second cladding layer 108, a part of the active layer 106, and a part of the first cladding layer 104. Although not shown in the drawings, the side surfaces of the columnar section 111 can be tilted.

As shown in FIGS. 1 and 3, the insulating sections (also referred to as the insulating layer) 116 can be disposed on the second cladding layer 108 and lateral to the columnar sections 111. The insulating sections 116 have contact with the side surfaces of the columnar sections 111. The upper surfaces of the insulating sections 116 can be contiguous to the upper surface of the contact layer 110. As the insulating section 116, for example, an SiN layer, an SiO$_2$ layer, and a polyimide layer can be used. If such materials are used as the insulating sections 116, the current between the electrodes 112, 114 can flow through the columnar sections 111 while avoiding the insulating sections 116. It is possible for the insulating sections 116 to have a refractive index smaller than the refractive index of the active layer 106. In this case, the effective refractive index of the vertical section in which the insulating section 116 is provided becomes smaller than that of the vertical section in which the insulating section 116 is not provided, namely the section in which the columnar section 111 is provided. Thus, it becomes possible to efficiently confine the light inside the gain regions 160, 162 with respect to the planar direction. It is also possible to eliminate the insulating sections 116. In other words, the insulating sections 116 can be an air. In this case, it is required to exclude the active layer 106 and the first cladding layer 104 from the columnar sections 111, or to prevent the second electrode 114 from having direct contact with the active layer 106 and the first cladding layer 104.

The first electrode 112 is formed on the entire bottom surface of the substrate 102. The first electrode 112 can have contact with the layer (the substrate 102 in the example shown in the drawings) having an ohmic contact with the first electrode 112. The first electrode 112 is electrically connected to the first cladding layer 104 via the substrate 102. The first electrode 112 is one side of the electrodes for driving the light emitting device 100. As the first electrode 112, for example, a stacking layer obtained by forming a Cr layer, an AuGe layer, an Ni layer, and an Au layer in this order from the side of the substrate 102 can be used. It is also possible to form the electrode 112 by disposing a second contact layer (not shown) between the first cladding layer 104 and the substrate 102, exposing the second contact layer using a dry etching process, and then disposing the first electrode 112 on the second contact layer. Thus, a single-sided electrode structure can be obtained. This form is particularly effective in the case that the substrate 102 is an insulating layer.

As shown in FIG. 3, the second electrode 114 is formed on the contact layer 110 (on the columnar sections 111). Although not shown in the drawings, the second electrode 114 can be formed on the entire upper surfaces of the contact layer 110 and the insulating sections 116. The second electrode 114 is electrically connected to the second cladding layer 108 via the contact layer 110. The second electrode 114 is the other side of the electrodes for driving the light emitting device 100. As the second electrode 114, for example, a stacking layer obtained by forming a Cr layer, an AuZn layer, and an Au layer in this order from the side of the contact layer 110 can be used. As shown in FIG. 2, the contact surface between the second electrode 114 and the contact layer 110 has substantially the same planar shape as those of the gain regions 160, 162.

As an example of the light emitting device 100, the case of InGaAlP type is explained above. However, according to the present embodiment, any material type capable of forming a light emitting gain region can be used in the light emitting device 100. In the case of semiconductor materials, such as an AlGaN type, an InGaN type, a GaAs type, an InGaAs type, a GaInNAs type, a ZnCdSe type can be used.

The light emitting device 100 according to the present embodiment can be applied to the light source for a projector, a monitor display, an illumination device, and a measuring device, for example.

The light emitting device 100 according to the present embodiment has the following features, for example.

According to the light emitting device 100, the laser oscillation of the light generated in the gain regions 160, 162 can be suppressed or prevented as described above. Therefore, the speckle noise can be reduced. Further, according to the light emitting device 100, the light generated in the gain regions 160, 162 can proceed in the gain regions 160, 162 while receiving a gain to be emitted to outside. Therefore, it is possible to obtain a higher output power than that of the general light emitting diode (LED) of the related art.

According to the light emitting device 100, the displacement L between the intersection point A and the overlapping plane 178 and the width W of the gain regions 160, 162 can satisfy the formula 1 described above, further the formula 2 described above, and still further the formula 3 described above. Therefore, the light emitting device 100 can emit the generated light efficiently. The details thereof will be described later.

According to the light emitting device 100, the part of the light 10 generated in the first gain region 160 is reflected by the overlapping plane 178, and can also proceed in the second gain region 162 while receiving a gain. Further, the same can be applied to part of the light generated in the second gain region 162. Therefore, according to the light emitting device 100, since the distance for amplifying the intensity of the light becomes longer compared to the case that the light is not reflected by the overlapping plane 178, the higher output power can be obtained.

2. Method of Manufacturing Light Emitting Device

Figure 5:
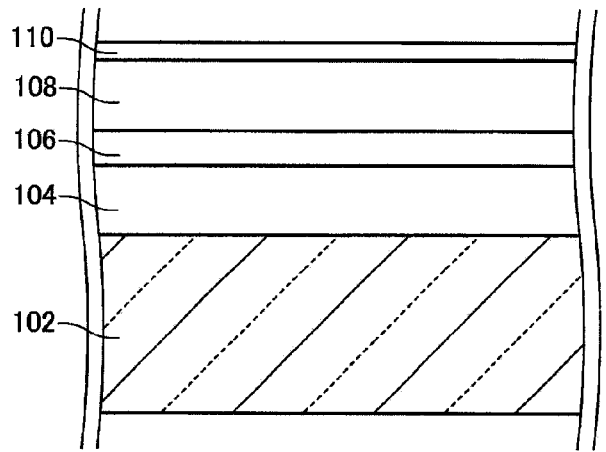
FIG. 5 is a cross-sectional view schematically showing a manufacturing process of the light emitting device according to the present embodiment.
Figure 6:
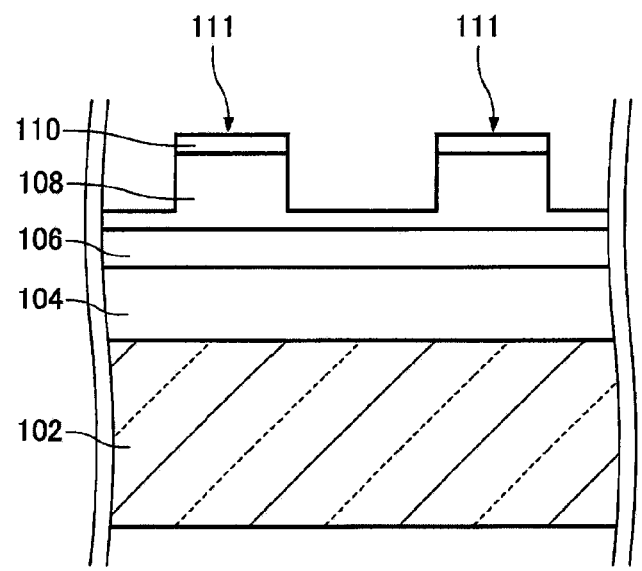
FIG. 6 is a cross-sectional view schematically showing the manufacturing process of the light emitting device according to the present embodiment.
Figure 7:
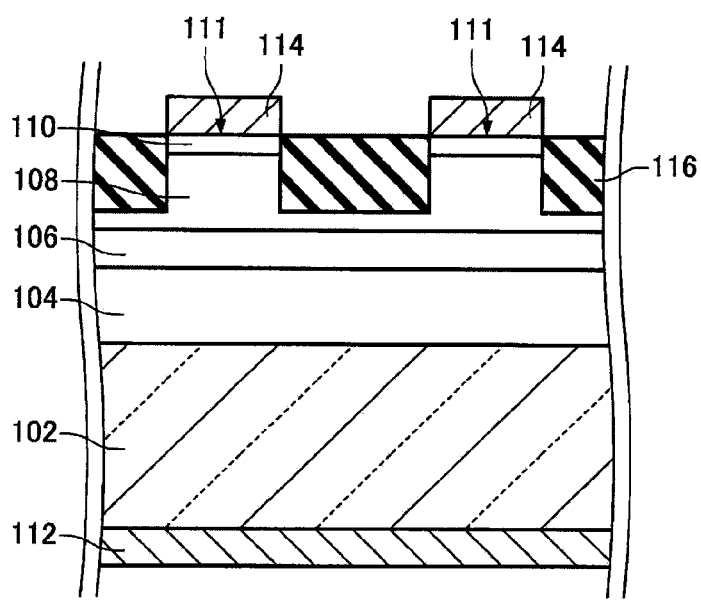
FIG. 7 is a cross-sectional view schematically showing the manufacturing process of the light emitting device according to the present embodiment.
Figure 8:
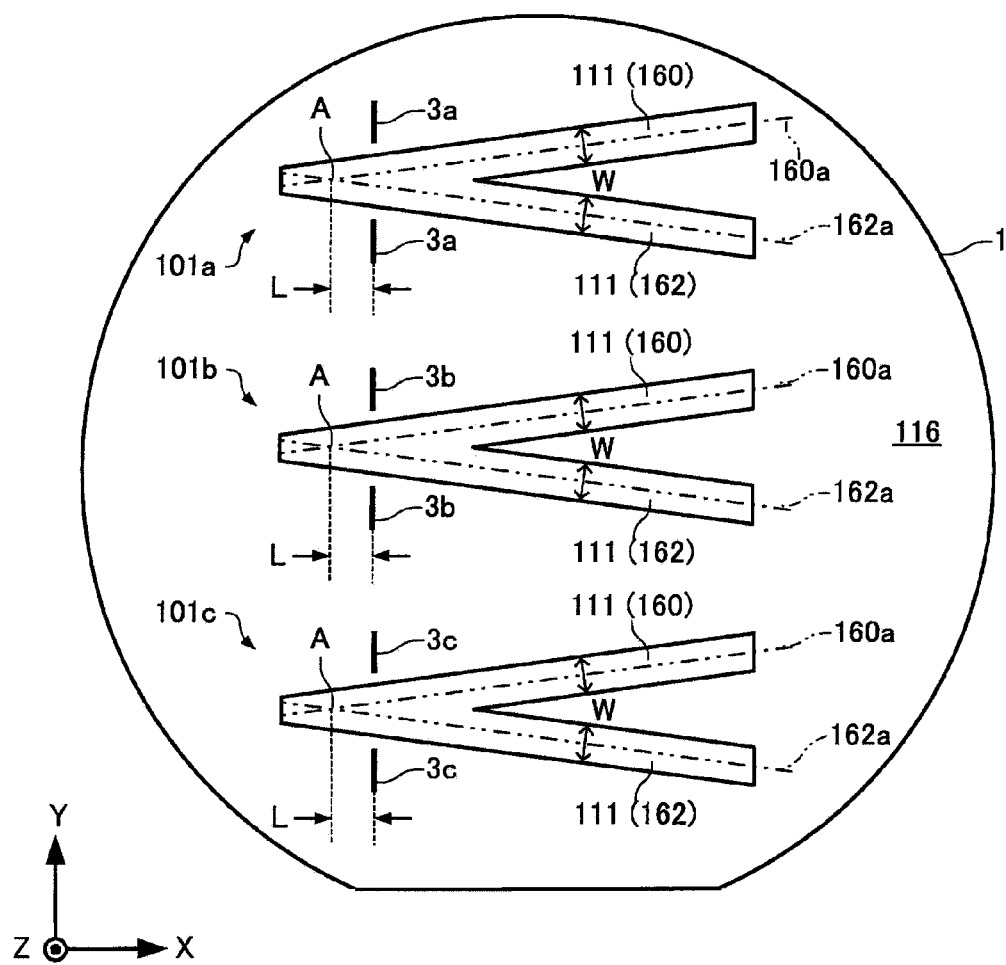
FIG. 8 is a plan view schematically showing the manufacturing process of the light emitting device according to the present embodiment.

Then, a method of manufacturing the light emitting device according to the present embodiment will be explained with reference to the accompanying drawings. FIGS. 5 through 7 are cross-sectional views schematically showing the manufacturing process of the light emitting device 100 according to the present embodiment corresponding to FIG. 3. FIG. 8 is a plan view schematically showing the manufacturing process of the light emitting device 100 according to the present embodiment. In FIG. 8, a second electrode 114 is omitted from illustration for the sake of convenience.

As shown in FIG. 5, the first cladding layer 104, the active layer 106, the second cladding layer 108, and the contact layer 110 are epitaxially grown on the substrate 102 in this order. As a method for growing the layers epitaxially, a metal organic chemical vapor deposition (MOCVD) method, a molecular beam epitaxy (MBE) method, and so on can be used.

As shown in FIG. 6, the contact layer 110 and the second cladding layer 108 are patterned. The patterning is performed by using, for example, a photolithography technique or an etching technique. According to the present process, the columnar sections 111 can be formed.

As shown in FIG. 7, the insulating sections 116 are formed so as to cover the side surfaces of the columnar sections 111. Firstly, an insulating layer (not shown) is formed as a film above the second cladding layer 108 (including the surface of the contact layer 110) using, for example, a chemical vapor deposition (CVD) method or a coating method. Subsequently, the upper surface of the contact layer 110 is exposed using, for example, an etching technique. Accordingly, the insulating sections 116 can be formed.

Subsequently, the second electrode 114 is formed on the contact layer 110. The second electrode 114 is formed using, for example, a vacuum deposition method.

Subsequently, the first electrode 112 is formed under the bottom surface of the substrate 102. The manufacturing method of the first electrode 112 is, for example, the same as that of the second electrode 114 described above. The order of forming the first electrode 112 and the second electrode 114 is not particularly limited. According to the process described above, a plurality of light emitting patterns can be formed inside a wafer.

Subsequently, as shown in FIG. 8, scribing lines 3 (3a, 3b, 3c) for separating a plurality of light emitting patterns 101 (101a, 101b, 101c) are provided to a wafer 1 having the plurality of light emitting patterns 101. Although the number of light emitting patterns 101 is three in the example shown in the drawing, the number is not particularly limited. The scribing lines 3 are formed using, for example, a diamond cutter or a laser. The light emitting device 100 can be obtained by cleaving the wafer 1 along the scribing lines 3 to separate the light emitting patterns 101. The scribing lines 3 can be provided for forming a cleavage surface including the second side surface 107. The scribing lines 3 are preferably formed at a position with a displacement L from the intersection point A of the first center line 160a and the second center line 162a toward the +X direction (toward the side of the first side surface 105). The displacement L preferably has a value that is half as large as the width W of the gain regions 160, 162. In other words, the displacement L between the scribing lines 3 and the intersection point A preferably satisfies the formula 3 described above. In this invention, in case of forming the scribing lines 3a on both sides of the light emitting pattern 101a as shown in the drawing, the displacement L between the intersection point A and the scribing line 3 denotes the displacement between the intersection point A and the straight line connecting both sides of the scribing lines 3a.

More specifically, as shown in FIG. 8, the scribing lines 3a are provided to the light emitting pattern 101a so as to satisfy the formula 3 described above, the scribing lines 3b are provided to the light emitting pattern 101b so as to satisfy the formula 3 described above, and the scribing lines 3c are provided to the light emitting pattern 101c so as to satisfy the formula 3 described above. In other words, the scribing lines 3 can be formed so as to satisfy the formula 3 described above with respect to the respective light emitting patterns 101. Therefore, it is possible that each of the scribing lines 3 is not continuous like a straight line, and is formed as a broken line as shown in FIG. 8, for example. Thus, it becomes possible to form the cleavage surfaces more accurately so as to satisfy the formula 3 with respect to the respective light emitting patterns 101. In particular, it is effective when displacement occurs in the patterning process and each of the light emitting patterns 101 is not formed along with the crystal plane.

Further, misalignment in manufacturing process might occur in the scribing process (forming scribing lines 3) themselves. For example, even if the scribing lines are formed aiming at the intersection point A, the scribing lines might be shifted in the −X direction (the opposite side of the first side surface 105) from the intersection point A. In this case, as described later, the light emitting device fails to emit light efficiently. Therefore, it is preferable to manufacture the scribing lines 3 aiming at the position satisfying the formula 3 described above in order to enhance the tolerance for the misalignment in the manufacturing process, and to obtain in a good yield the light emitting device 100 capable of emitting light efficiently.

As shown in FIGS. 1 and 2, the reflective section 130 is formed on the entire surface of the side of the second side surface 107. The reflective section 130 is formed using, for example, a CVD method, a sputtering method, or an ion assisted deposition method.

According to the process described above, the light emitting device 100 can be manufactured.

According to a method for manufacturing the light emitting device 100, the light emitting device 100 capable of efficiently emitting the light can be obtained. The details thereof will be described later.

3. Experimental Example of Light Emitting Device

Figure 9:
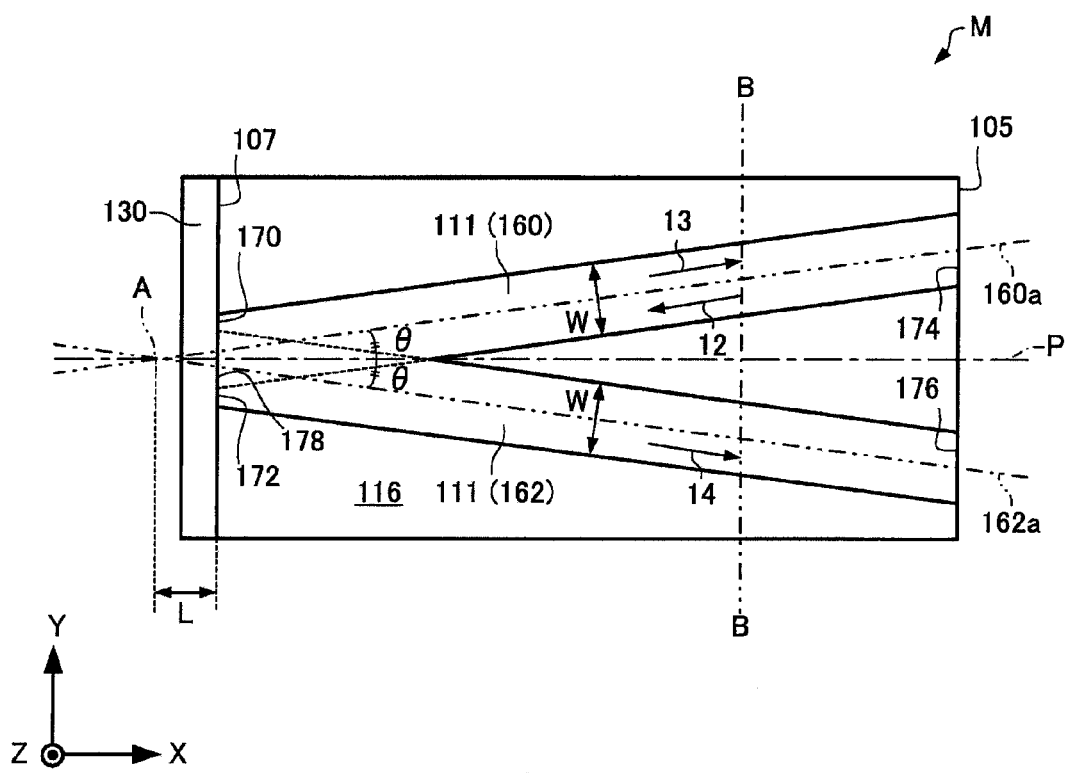
FIG. 9 is a plan view schematically showing a model used as an experimental example of the light emitting device according to the present embodiment.
Figure 10:
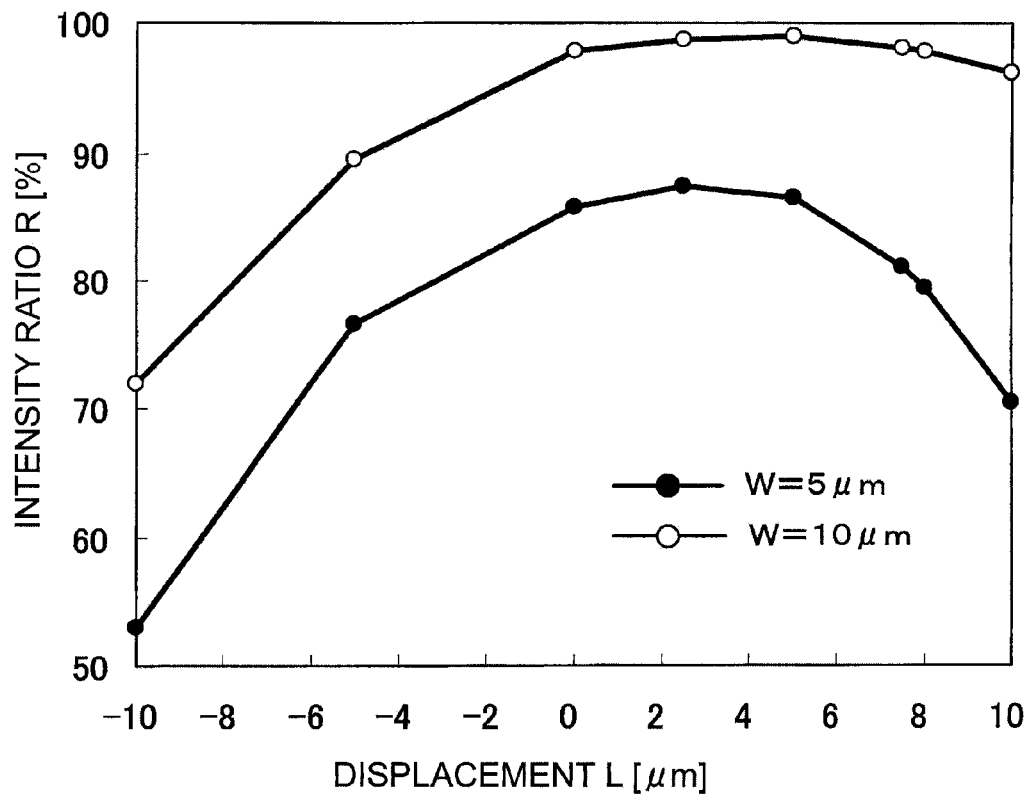
FIG. 10 is a graph showing a result of the experimental example of the light emitting device according to the present embodiment.

Then, an experimental example of the light emitting device according to the present embodiment will be explained with reference to the accompanying drawings. Specifically, a simulation in a model M obtained by modeling the first gain region 160, the second gain region 162, and the reflective section 130 of the light emitting device 100 according to the present embodiment will be explained. FIG. 9 is a plan view schematically showing the model M of the light emitting device 100 according to the present embodiment. FIG. 10 is a graph showing a result of the simulation in the model M of the light emitting device 100 according to the present embodiment.

Firstly, the configuration of the model M will be explained.

In the model M, the vicinity of the overlapping plane 178 of the light emitting device 100 according to the present embodiment is analyzed. More specifically, as shown in FIG. 9, an end of the calculation area on the side of the third end surface 174 and on the side of the fourth end surface 176 is defined as a calculation end section B-B line. The light 12 with the intensity $I_{12}$ proceeding from the vicinity of the calculation end section B-B line of the first gain region 160 toward the first end surface 170 are generated, and the light 13 with the intensity $I_{13}$ proceeding from the first end surface 170 toward the calculation end section B-B line and the light 14 with the intensity $I_{14}$ having reached the calculation end section B-B line of the second gain region 162 is monitored. It should be noted that in the model M, there used a absorbing boundary conditions that almost all light having reached the calculation end section B-B line is transmitted through the B-B line without reflected toward outside. In other words, all of the light 14 having reached the calculation end section B-B line is transmitted through the B-B line and then emitted to outside of the calculation area (to the +X direction side from the calculation end B-B line), and there is no light returning to inside the gain regions 160, 162. Therefore, even if the end surface of the first gain region 160 in the calculation area overlaps when viewed from the side of the first side surface 105 in a planar manner by limiting the calculation area, the multiple reflection is never caused inside the first gain region 160. Similarly, also in the second gain region 162, the multiple reflection is never caused. As described above, since the multiple reflection is never caused in the model M, there is no chance to form a resonator.

In the model M, the intensity $I_{14}$ of the light 14 is monitored while fixing the position of the first side surface 105, and varying the displacement L between the second side surface 107 (the overlapping plane 178) and the intersection point A of the first center line 160a and the second center line 162a. In the model M, it is assumed that the light 12 proceeds inside the first gain region 160 from the vicinity of the calculation end section B-B line of the first gain region 160 toward the first end surface 170, then proceeds inside the second gain region 162 via the overlapping plane 178, then reaches the calculation end section B-B line of the second gain region 162 as the light 14, and is then transmitted to outside the calculation area. In the model M, it is assumed that the light 12 does not receive a gain in the gain regions 160, 162 for the sake of calculation convenience. Therefore, in the model M, by monitoring the intensity $I_{14}$ of the light 14, it becomes possible to calculate the loss with respect to the intensity $I_{12}$ of the light 12.

In the model M, it is assumed that the effective refractive index of the gain regions 160, 162 (i.e., the effective refractive index of the columnar section) is 3.346, and that of the region without constituting the gain regions 160, 162 (i.e., the effective refractive index of the outside of the columnar section) is 3.344. In the model M, it is assumed that the angles θ of the gain regions 160, 162 with respect to the perpendicular line P of the first side surface 105 are both 10 degrees. In the model M, as the reflective section 130, for example, a dielectric mirror having 10 pairs of layers of $SiO_2$ and $Ta_2O_5$ stacked in this order from the side of the second side surface 107. The $SiO_2$ layer is arranged to have a refractive index of 1.43, and the thickness of one layer of which is 113.61 nm. The $Ta_2O_2$ layer is arranged to have a refractive index of 2.16, and the thickness of one layer of which is 75.22 nm. In the model M, the simulation is performed by setting the width W of the gain region 160, 162 to be 5 μm and 10 μm.

Then, the result of the simulation will be explained.

In the graph shown in FIG. 10, the horizontal axis represents the displacement L, and the vertical axis represents an intensity ratio R. In the displacement L on the horizontal axis, the point at which the intersection point A and the second side surface 107 overlap with each other corresponds to zero, the case in which the second side surface 107 is displaced to the side of the first side surface 105 (+X direction) corresponds to the positive value (i.e., the value of the displacement L is positive), and the case in which the second side surface 107 is displaced to opposite the side of the first side surface 105 (−X direction) corresponds to the negative value (i.e., the value of the displacement L is negative). The intensity ratio R on the vertical axis represents the ratio ($I_{14}/I_{12}\times100(\%)$) of the intensity $I_{14}$ of the light 14 with respect to the intensity $I_{12}$ of the light 12. In other words, it can be said that the higher the intensity ratio R is, the smaller the loss of the light is, and the more efficiently the light can be emitted.

According to FIG. 10, it is understood that the intensity ratio R in the range (the range of the formula 1 described above) satisfying 0<L<W is substantially equivalent to or higher than the intensity ratio R at L=0. Further, it is understood that the intensity ratio R in the range satisfying (W/4)≦L≦(3W/4) (the range of the formula 2 described above) is surely higher than the intensity ratio R at L=0. Further, it is understood that in the case of L=(W/2) (the case of the formula 3) the intensity ratio R takes the maximum value, and the loss of light becomes minimum.

The reason that the loss of light becomes smaller due to the relationship between the displacement L and the width W described above can be inferred as follows.

The distance between the first gain region 160 and the second gain region 162 decreases as the first and second gain regions 160, 162 come closer to the second side surface 107. Then, due to the evanescent coupling, some component of the light proceeding in the first gain region 160 toward the first end surface 170 begins to move to the second gain region 162 without going via the overlapping plane 178. In other words, the light proceeding in the first gain region 160 toward the first end surface 170 senses the second gain region 162 as a highly refractive region, and some of the light begins to move toward the second gain region 162 and thereby be deflected. Assuming the case that the refractive index difference between the gain regions 160, 162 and the surrounding region is small, part of the light being deflected toward the second gain region 162 might pass through the second gain region 162 directly to cause the loss. In order to prevent such light from being loss and to input such light in the second gain region 162, it is required to make the reflecting plane come closer in accordance with the path of the light thus deflected. Therefore, it can be inferred that the intensity ratio R can be raised because such light loss can be reduced by setting the L to be a positive value and the relationship between the displacement L and the width W to be the relationship expressed by the formula 1, preferably the formula 2, and further preferably the formula 3 described above.

As described above, in the light emitting device 100, the displacement L and the width W can satisfy the formula 1, further the formula 2, and still further the formula 3 described above. Therefore, in the light emitting device 100, the loss of light can be reduced, and the light can be emitted efficiently. Further, since the light emitting device 100 can emit light efficiently, miniaturization thereof can be achieved accordingly.

4. Modified Example

Figure 11:
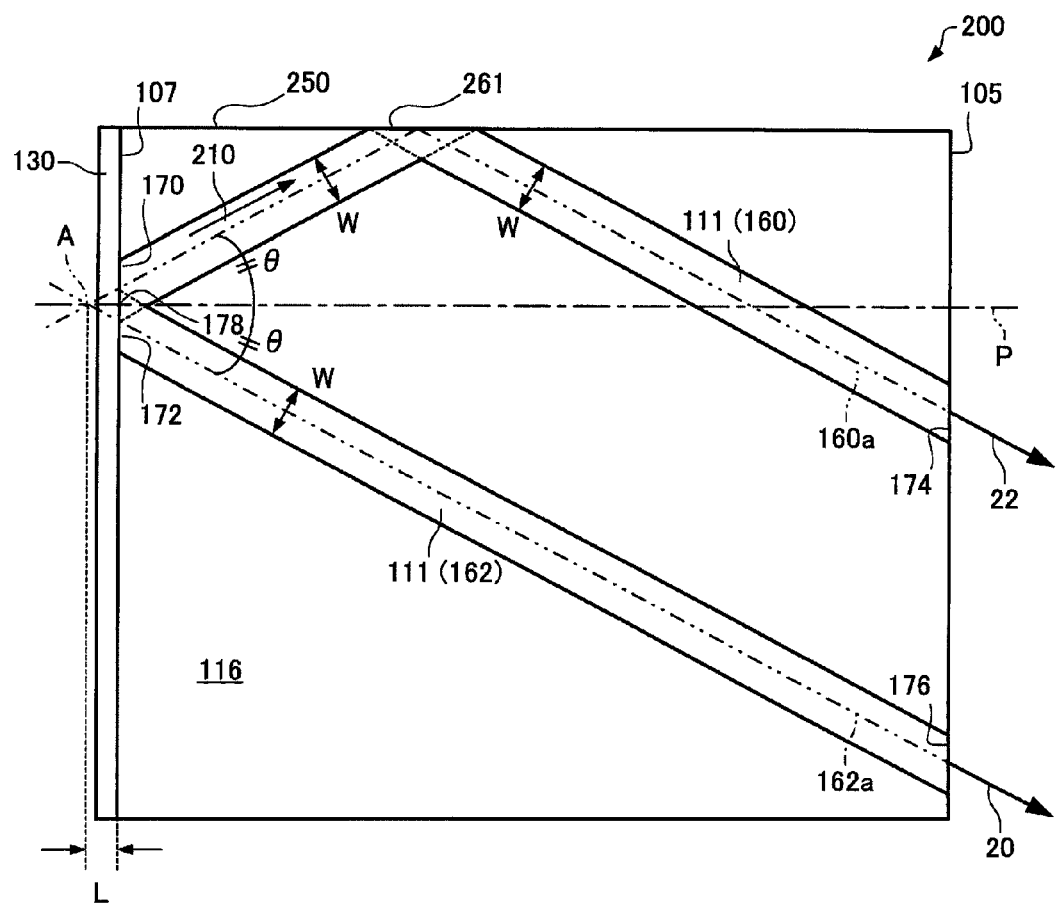
FIG. 11 is a plan view schematically showing a light emitting device according to a modified example of the present embodiment.

Then, a light emitting device 200 according to a modified example of the present embodiment will be explained with reference to the accompanying drawings. FIG. 11 is a perspective view schematically showing the light emitting device 200. Hereinafter, in the light emitting device 200 according to the modified example of the present embodiment, the constituents thereof having the same functions as those of the constituents of the light emitting device 100 according to the present embodiment will be denoted by the same reference symbols, and detailed explanations thereof will be omitted. In FIG. 11, the second electrode 114 is omitted from illustration for the sake of convenience.

As shown in FIG. 11, in the light emitting device 200, the first gain region 160 is provided with a reflecting plane 261 between the first end surface 170 and the third end surface 174. In the example shown in the drawing, the reflecting plane 261 is disposed on a third side surface 205 perpendicular to the first side surface 105 and the second side surface 107 of the active layer 106. In the first gain region 160, the light 210 proceeding from the first end surface 170 to the reflecting plane 261 can be reflected (e.g., totally reflected) by the reflecting plane 261 and thereby proceed from the reflecting plane 261 toward the third end surface 174. Subsequently, the light 210 can be emitted from the third end surface 174 as the outgoing light 22. In the example shown in the drawing, the light 22 emitted from the third end surface 174 and the light 20 emitted from the fourth end surface can proceed in the same direction.

Although not shown in the drawing, the reflecting plane 261 can be provided only to the second gain region 162 instead of the first gain region 160, or can be provided to each of the gain regions 160, 162. Further, the third end surface 205 provided with the reflecting plane 261 can also be provided with a reflecting section. The reflecting plane 261 can also be provided to an opening section formed in the active layer 106 by etching instead of the third end surface 205. The light 22 emitted from the third end surface 174 and the light 20 emitted from the fourth end surface can also proceed in a converging direction.

According to the light emitting device 200, the light 22 emitted from the third end surface 174 and the light 20 emitted from the fourth end surface 176 can proceed in the same direction or a converging direction. Thus, although not shown in the drawings, it becomes possible to miniaturize the optical system (the optical system to which the outgoing light 20, 22 incidents) compared to the case that the two outgoing light proceed in a diverging direction.

As described above, although the embodiment of the invention is explained in detail, it should be easily understood by those skilled in the art that various modifications not substantially departing from the novel matters and the effects of the invention are possible. Therefore, such modified examples should be included in the scope of the invention.

The entire disclosure of Japanese Patent Application No: 2009-062502, filed Mar. 16, 2009 is expressly incorporated by reference herein.

What is claimed is:

1. A light emitting device comprising:
a first cladding layer;
an active layer formed above the first cladding layer; and
a second cladding layer formed above the active layer,
wherein the active layer includes a first side surface and a second side surface parallel to the first side surface,
at least a part of the active layer configures a first gain region and a second gain region, the first gain region has a first end surface on the second side surface and a third end surface on the first side surface, and the second gain region has a second end surface on the second side surface and a fourth end surface on the first side surface,
a second reflectance of the second side surface is higher than a first reflectance of the first side surface at a wavelength range of light generated in the first gain region and the second gain region,
a part of the first end surface of the first gain region overlaps with the second end surface of the second gain region to configure an overlapping plane,
a first center line connecting a first center of the first end surface and a third center of the third end surface is angled relative to a perpendicular direction relative to the first side surface, a second center line connecting a second center of the second end surface and a fourth center of the fourth end surface is angled relative to the perpendicular direction, and the first center line and the second center line intersect at an intersection point,
the overlapping plane is shifted from the intersection point in a shift direction from the second side surface toward the first side surface
in a plan view, a width W of the first gain region in the vicinity of the overlapping plane and the width W of the second gain region in the vicinity of the overlapping plane are equal to each other, and
when a length between the intersection point and the overlapping plane is L, the width W and the length L satisfy the following formula 1;

$$0 < L < W \quad (1).$$

2. The light emitting device according to claim 1, wherein the displacement L and the width W satisfy the following formula 2

$$(W/4) \leq L \leq (3W/4) \quad (2).$$

3. The light emitting device according to claim 2, wherein the displacement L and the width W satisfy the following formula 3

$$L = (W/2) \quad (3).$$

4. The light emitting device according to claim 1, wherein the first gain region is disposed from the first end surface to the third end surface with a first constant width W1,
the second gain region is disposed from the second end surface to the fourth end surface with a second constant width W2, and
the first and second constant widths W1, W2 are equal to each other.

5. The light emitting device according to claim 1, wherein the second side surface is provided with a reflecting section.

6. The light emitting device according to claim 1, wherein a planar shape of the first gain region and a planar shape of the second gain region are axisymmetrical with each other with respect to a perpendicular line that is parallel to the perpendicular direction and that extends from the overlapping plane.

7. The light emitting device according to claim 1, wherein the first gain region has a reflecting plane which reflects light proceeding in the first gain region between the first end surface and the third end surface, and
light emitted from the third end surface and light emitted from the fourth end surface proceed in the same direction or converging direction.

8. The light emitting device according to claim 1, wherein in a plan view viewed from the side of the first side surface of the active layer,
there is no overlap between the first end surface and the third end surface of the first gain region, and
there is no overlap between the second end surface and the fourth end surface of the second gain region.

9. The light emitting device according to claim 1, wherein part of the light generated from the first gain region is reflected by the overlapping plane, and is emitted from the fourth end surface of the second gain region, and part of the light generated from the second gain region is reflected by the overlapping plane, and is emitted from the third end surface of the first gain region.

10. The light emitting device according to claim 1, further comprising:
   a first electrode electrically connected to the first cladding layer; and
   a second electrode electrically connected to the second cladding layer.

11. The light emitting device according to claim 10, further comprising:
   a contact layer formed above the second cladding layer, and having an ohmic contact with the second electrode,
   wherein at least the contact layer and a part of the second cladding layer constitute a columnar section, and
   the columnar section has a planar shape identical to a planar shape of the first gain region and the second gain region.

* * * * *